(12) United States Patent
Huang

(10) Patent No.: US 10,673,022 B2
(45) Date of Patent: Jun. 2, 2020

(54) ORGANIC LIGHT EMITTING DIODE DISPLAY DEVICE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Hui Huang, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 81 days.

(21) Appl. No.: 16/111,874

(22) Filed: Aug. 24, 2018

(65) Prior Publication Data
US 2019/0312231 A1    Oct. 10, 2019

Related U.S. Application Data

(63) Continuation of application No. PCT/CN2018/089410, filed on May 31, 2018.

(30) Foreign Application Priority Data

Apr. 10, 2018 (CN) .......................... 2018 1 0317687

(51) Int. Cl.
*H01L 21/00* (2006.01)
*H01L 51/52* (2006.01)
*H01L 51/56* (2006.01)

(52) U.S. Cl.
CPC ...... *H01L 51/5259* (2013.01); *H01L 51/5253* (2013.01); *H01L 51/56* (2013.01)

(58) Field of Classification Search
CPC .. H01L 51/5259; H01L 51/5253; H01L 51/56
See application file for complete search history.

(56) References Cited

U.S. PATENT DOCUMENTS

2019/0051851 A1* 2/2019 Shimogawara ........ H05B 33/10

FOREIGN PATENT DOCUMENTS

| CN | 1498038 A | 5/2004 |
|----|-----------|--------|
| CN | 106711354 A | 5/2017 |

* cited by examiner

*Primary Examiner* — Victor A Mandala
*Assistant Examiner* — Colleen E Snow
(74) *Attorney, Agent, or Firm* — Leong C. Lei

(57) ABSTRACT

Provided are an organic light emitting diode display device and a manufacturing method thereof. The method includes: preparing a thin film transistor layer on a glass substrate; preparing an organic light emitting diode element layer on the thin film transistor layer, and preparing a barrier layer and a buffer layer on the glass substrate, wherein the barrier layer covers the OLED element layer; preparing the plurality of grooves in the barrier layer, and preparing a water absorbing material layer in the plurality of grooves. The permeability of water and oxygen is reduced for lowering the risk of breakage of the barrier layer and the buffer layer, and improving the service life of the OLED display device.

12 Claims, 2 Drawing Sheets

Non-light emitting area

ORGANIC LIGHT EMITTING DIODE DISPLAY DEVICE AND MANUFACTURING METHOD THEREOF

CROSS-REFERENCE TO RELATED APPLICATION

This application is a continuing application of PCT Patent Application No. PCT/CN2018/089410 entitled "Organic light emitting diode display device and manufacturing method thereof", filed on May 31, 2018, which claims priority to Chinese Patent Application No. 201810317687.X, filed on Apr. 10, 2018, both of which are hereby incorporated in its entireties by reference.

FIELD OF THE INVENTION

The present invention relates to a display field, and more particularly to an organic light emitting diode display device and a manufacturing method thereof.

BACKGROUND OF THE INVENTION

In the current field of lighting and display, due to the properties of the OLED (Organic Light-Emitting Diode), such as low start-up voltage, lightness, thinness and self-luminescence, more and more OLEDs are widely studied for the development of lighting products and panel industry to meet the requirements of low energy consumption, light weight and surface light sources. At present, due to the properties of flexibility, thinness, and self-luminescence of the OLED flexible display panel, more and more OLED flexible display products are created.

At present, the structure of the OLED display device is performed by using a thin film package as shown in FIG. 1. The numbers 1', 2', 3', 4', 5', 6', 7' and 8' respectively indicate the glass substrate and the TFT (Thin Film Transistor) layer, the pixel layer, the first barrier layer, the first buffer layer, the second barrier layer, the second buffer layer and the third barrier layer. However, since the thin film barrier layer and the buffer layer are thin, there is a stress between the layers. Therefore, the ability of the barrier layer and the buffer layer for blocking water and oxygen does not achieve the desired effect. The water-oxygen permeability is high, and the barrier layer and the buffer layer are more likely to break and cause the package to fail.

SUMMARY OF THE INVENTION

For solving the aforesaid technical problems, the present invention provides an organic light emitting diode display device and a manufacturing method thereof, which can reduce the permeability of water and oxygen for lowering the risk of breakage of the barrier layer and the buffer layer, and improving the service life of the OLED display device.

The present invention provides a manufacturing method of an organic light emitting diode display device, comprising:

preparing a thin film transistor layer on a glass substrate;
preparing an organic light emitting diode element layer on the thin film transistor layer, and preparing a barrier layer and a buffer layer on the glass substrate, wherein the barrier layer covers the organic light emitting diode element layer;
preparing a plurality of grooves in the barrier layer, and preparing a water absorbing material layer in the plurality of grooves.

Preferably, preparing the barrier layer and the buffer layer on the glass substrate comprises:
sequentially preparing a first barrier layer, a first buffer layer and a second barrier layer on the glass substrate;
preparing the plurality of grooves in the barrier layer comprises:
preparing the plurality of grooves in the second barrier layer;
preparing the barrier layer and the buffer layer on the glass substrate further comprises:
preparing a second buffer layer and a third barrier layer on the second barrier layer.

Preferably, preparing the organic light emitting diode element layer on the thin film transistor layer comprises:
preparing a plurality of organic light emitting diode elements on the thin film transistor layer, wherein the plurality of organic light emitting diode elements are arranged at intervals.

Preferably, preparing the plurality of grooves in the barrier layer comprises:
preparing the plurality of grooves in a non-light emitting area in the barrier layer; wherein the non-light emitting area is an area in the barrier layer outside an area directly above the organic light emitting diode display elements.

Preferably, preparing the water absorbing material layer in the plurality of grooves comprises:
preparing the water absorbing material layer in the plurality of grooves by one of coating, spraying and inkjet printing.

Preferably, a material of the water absorbing material layer is a polyvinyl alcohol material and/or a polyoxyethylene material, and the barrier layer is made of SiNx and/or SiOx.

The present invention further provides a manufacturing method of an organic light emitting diode display device, comprising:

preparing a thin film transistor layer on a glass substrate;
preparing an organic light emitting diode element layer on the thin film transistor layer, and preparing a barrier layer and a buffer layer on the glass substrate, wherein the barrier layer covers the organic light emitting diode element layer;
preparing a plurality of grooves in the barrier layer, and preparing a water absorbing material layer in the plurality of grooves;
wherein preparing the barrier layer and the buffer layer on the glass substrate comprises:
sequentially preparing a first barrier layer, a first buffer layer and a second barrier layer on the glass substrate;
preparing the plurality of grooves in the barrier layer comprises:
preparing the plurality of grooves in the second barrier layer;
preparing the barrier layer and the buffer layer on the glass substrate further comprises:
preparing a second buffer layer and a third barrier layer on the second barrier layer;
wherein a material of the water absorbing material layer is a polyvinyl alcohol material and/or a polyoxyethylene material, and the barrier layer is made of SiNx and/or SiOx.

Preferably, preparing the organic light emitting diode element layer on the thin film transistor layer comprises:
preparing a plurality of organic light emitting diode elements on the thin film transistor layer, wherein the plurality of organic light emitting diode elements are arranged at intervals.

Preferably, preparing the plurality of grooves in the barrier layer comprises:

preparing the plurality of grooves in a non-light emitting area in the barrier layer; wherein the non-light emitting area is an area in the barrier layer outside an area directly above the organic light emitting diode display elements.

Preferably, preparing the water absorbing material layer in the plurality of grooves comprises:

preparing the water absorbing material layer in the plurality of grooves by one of coating, spraying and inkjet printing.

The present invention further provides an organic light emitting diode display device, comprising a glass substrate, a thin film transistor layer disposed on the glass substrate, an organic light emitting diode element layer disposed on the thin film transistor layer, a barrier layer and a buffer layer disposed on the glass substrate, wherein the barrier layer covers the organic light emitting diode element layer;

wherein a plurality of grooves is disposed in the barrier layer, and a material of the water absorbing material layer is disposed in the plurality of grooves.

Preferably, the barrier layer comprises a first barrier layer and a second barrier layer, and the buffer layer comprises a first buffer layer and a second buffer layer;

the first barrier layer, the first buffer layer, the second barrier layer, the second buffer layer and the third barrier layer are sequentially arranged in a direction away from the organic light emitting diode element layer, and the plurality of grooves is disposed in the second barrier layer.

Preferably, the organic light emitting diode element layer comprises a plurality of organic light emitting diode elements, and each of the grooves is located in a non-light emitting area of the barrier layer, wherein the non-light emitting area is an area in the barrier layer outside an area directly above the organic light emitting diode display elements.

Preferably, a material of the water absorbing material layer is a polyvinyl alcohol material and/or a polyoxyethylene material, and the barrier layer is made of SiNx and/or SiOx.

The implementation of the present invention possesses the following benefits: in the present invention, by disposing the water absorbing material layer in the barrier layer, water and oxygen can be prevented from penetrating into the organic light emitting diode display device and the water-oxygen permeability can be reduced. The water and oxygen penetration into the thin film transistor layer and the organic light emitting diode layer can be reduced. It can be avoided that the water-oxygen permeability of the barrier layer and the buffer layer is too high to cause the fracture and the package failure can also be avoided to improve the service life of the organic light emitting diode display device.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
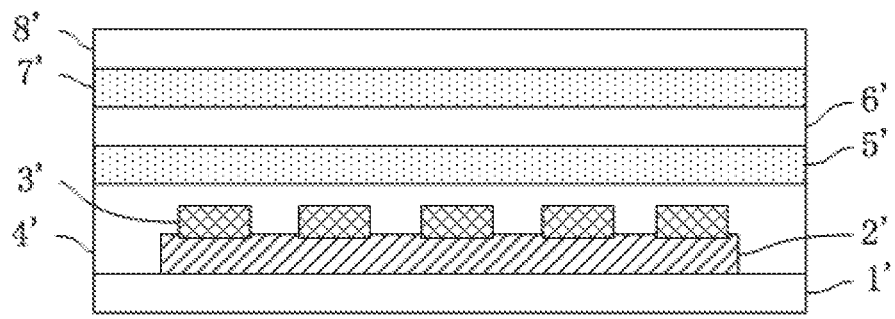
FIG. 1 is a structural diagram of an organic light emitting diode display device in the prior art of the present invention.
Figure 2:
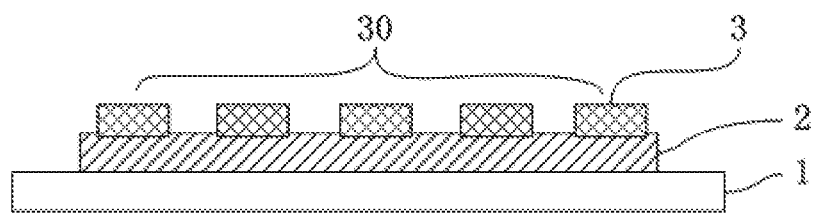
FIG. 2 is a diagram of a thin film transistor layer and an organic light emitting diode display element layer prepared on a glass substrate according to the present invention.

The present invention provides a manufacturing method of an organic light emitting diode (OLED) display device, comprising:

as shown in FIG. 2, preparing a thin film transistor (TFT) layer 2 on a glass substrate 1; wherein the thin film transistor (TFT) layer 2 comprises a plurality of thin film transistors to form a driving circuit to drive the organic light emitting diode elements to emit light;

preparing an organic light emitting diode (OLED) element layer 30 on the thin film transistor layer 2, and preparing a barrier layer and a buffer layer on the glass substrate 1, wherein the barrier layer covers the organic light emitting diode element layer 30; wherein in general, the barrier layer is used to block water vapor and oxygen; here, the barrier layer and the buffer layer constitute a thin film packaging layer;

preparing a plurality of grooves 61 in the barrier layer, and preparing a water absorbing material layer 7 in the plurality of grooves 61, wherein here, the water absorbing material layer 7 can be used to absorb water and oxygen.

Figure 3:
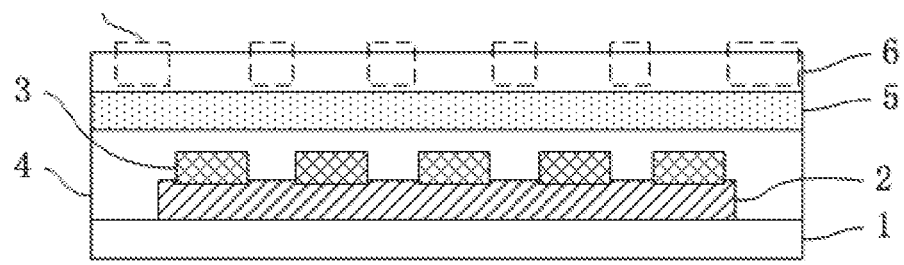
FIG. 3 is a diagram of a first barrier layer, a first buffer layer and a second barrier layer prepared on a glass substrate according to the present invention.

Furthermore, preparing the barrier layer and the buffer layer on the glass substrate 1 comprises:

as shown in FIG. 3, sequentially preparing a first barrier layer 4, a first buffer layer 5 and a second barrier layer 6 on the glass substrate 1 by chemical vapor deposition.

Figure 4:
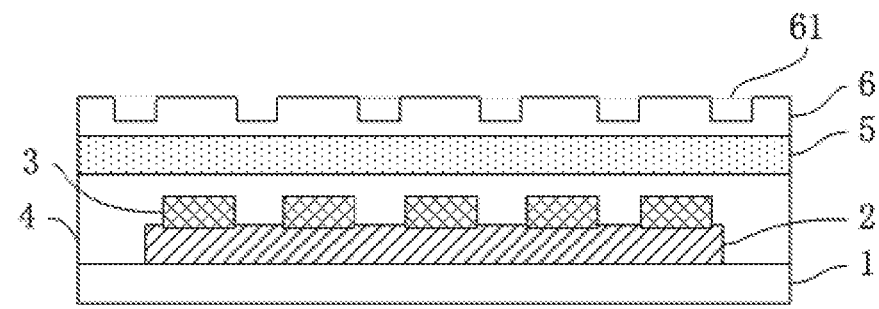
FIG. 4 is a diagram of a plurality of grooves prepared on a second barrier layer according to the present invention.
Figure 5:
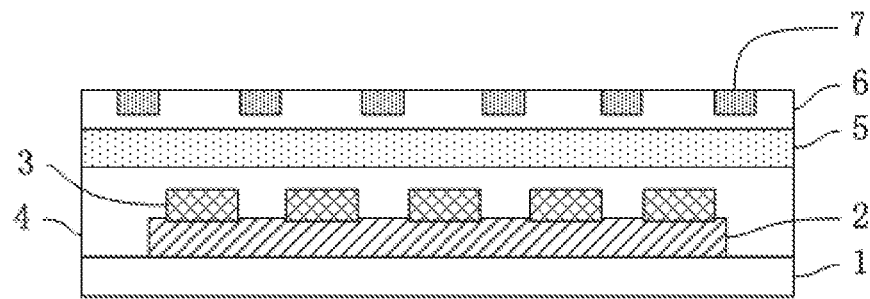
FIG. 5 is a diagram of a water absorbing material layer prepared in a plurality of groove according to the present invention.

Preparing the plurality of grooves 61 in the barrier layer comprises:

as shown in FIG. 4, patterning the second barrier layer 6, and preparing the plurality of grooves 61 in the second barrier layer 6; as shown in FIG. 5, preparing the water absorbing material layer 7 in the plurality of grooves 61 in the second barrier layer 6.

Figure 6:
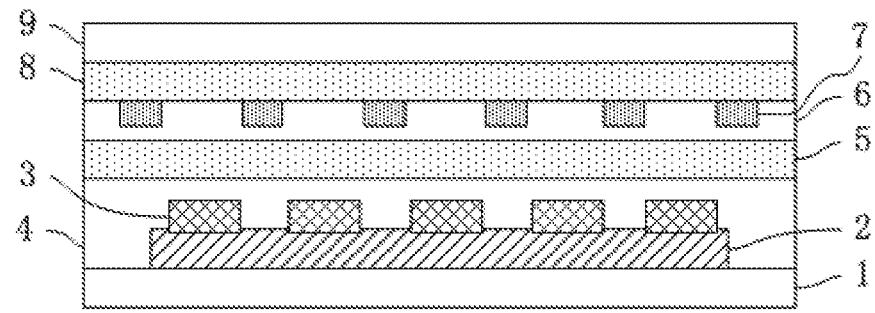
FIG. 6 is a diagram of a second buffer layer and a third barrier layer prepared on the second barrier layer according to the present invention.

Preparing the barrier layer and the buffer layer on the glass substrate 1 further comprises:

as shown in FIG. 6, preparing a second buffer layer 8 and a third barrier layer 9 on the second barrier layer 6.

Certainly, it is also possible to prepare the plurality of grooves 61 in the first barrier layer 4 and the third barrier layer 9, and it is also possible to prepare the water absorbing material layer 7 in the plurality of grooves 61 of the first barrier layer 4 and the third barrier layer 9.

Furthermore, preparing the organic light emitting diode element layer 30 on the thin film transistor layer 2 comprises:

preparing a plurality of organic light emitting diode elements 3 on the thin film transistor layer 2, wherein the plurality of organic light emitting diode elements 3 are arranged at intervals. Here, the organic light emitting diode elements 3 may be organic light emitting diode elements 3 that emit white light, and may also be organic light emitting diode elements 3 that emit light of other colors, such as red, green, blue or the like.

Preparing the plurality of grooves 61 in the barrier layer comprises:

preparing the plurality of grooves 61 in a non-light emitting area in the barrier layer; wherein the non-light emitting area is an area in the barrier layer outside an area directly above the organic light emitting diode display elements 3 as shown in the dashed frame area in FIG. 3; correspondingly, the light emitting area is an area directly above the organic light emitting diode display elements 3. The light emitting area is a pixel area corresponding to the organic light emitting diode display device.

preparing the water absorbing material layer 7 in the plurality of grooves 61 comprises:

preparing the water absorbing material layer 7 in the plurality of grooves 61 by one of coating, spraying and inkjet printing.

Furthermore, a material of the water absorbing material layer 7 is a polyvinyl alcohol material and/or a polyoxyethylene material, and the barrier layer is made of SiNx and/or SiOx, and x>0.

The present invention further provides an organic light emitting diode display device, comprising a glass substrate 1, a thin film transistor layer 2 disposed on the glass substrate 1, an organic light emitting diode element layer 30 disposed on the thin film transistor layer 2, a barrier layer and a buffer layer disposed on the glass substrate 1, and the barrier layer covers the organic light emitting diode element layer 30.

A plurality of grooves 61 is disposed in the barrier layer, and a water absorbing material layer 7 is disposed in the plurality of grooves 61.

Furthermore, the barrier layer comprises a first barrier layer 4, a second barrier layer 6, and the buffer layer comprises a first buffer layer 5 and a second buffer layer 8.

The first barrier layer 4, the first buffer layer 5, the second barrier layer 6, the second buffer layer 8 and the third barrier layer 9 are sequentially arranged in a direction away from the organic light emitting diode element layer 30, and the plurality of grooves 61 is disposed in the second barrier layer 6.

Furthermore, the organic light emitting diode element layer 30 comprises a plurality of organic light emitting diode elements 3, and each of the grooves 61 is located in a non-light emitting area of the barrier layer, wherein the non-light emitting area is an area in the barrier layer outside an area directly above the organic light emitting diode display elements 3.

Furthermore, a material of the water absorbing material layer 7 is a polyvinyl alcohol material and/or a polyoxyethylene material, and the barrier layer is made of SiNx and/or SiOx.

In conclusion, in the organic light emitting diode display device provided by the present invention, the water absorbing material layer 7 is prepared inside the thin film packaging layer composed of the barrier layer and the buffer layer to prevent water and oxygen from penetrating into the organic light emitting diode display device and the water-oxygen permeability can be reduced. The water absorbing material layer 7 is disposed in the non-light emitting area in the barrier layer. After the water and oxygen penetrate the barrier layer, the water and oxygen may be absorbed before entering the light emitting area, so that the service life of the organic light emitting diode display device can be improved. Meanwhile, since the water absorbing material layer 7 is disposed in the non-light emitting area in the barrier layer, it is possible to prevent the transmittance of the water absorbing material layer 7 after water-oxygen absorption from decreasing, thus affecting the normal light-emitting efficiency of the organic light emitting diode display device; therefore, according to the present invention, under the premise of improving the effect of the thin film package of the organic light emitting diode display device, the light emitting performance of the organic light emitting diode display device will not be affected.

The above content with the specific preferred embodiments of the present invention is further made to the detailed description, the specific embodiments of the present invention should not be considered limited to these descriptions. Those of ordinary skill in the art for the present invention, without departing from the spirit of the present invention, can make various simple deduction or replacement, should be deemed to belong to the scope of the present invention.

What is claimed is:

1. A manufacturing method of an organic light emitting diode display device, comprising:

preparing a thin film transistor layer on a glass substrate;

preparing an organic light emitting diode element layer on the thin film transistor layer, and preparing a barrier layer and a buffer layer on the glass substrate, wherein the barrier layer covers the organic light emitting diode element layer;

preparing a plurality of grooves in the barrier layer, and preparing a water absorbing material layer in the plurality of grooves;

wherein preparing the barrier layer and the buffer layer on the glass substrate comprises:

sequentially preparing a first barrier layer, a first buffer layer and a second barrier layer on the glass substrate;

preparing the plurality of grooves in the barrier layer comprises:

preparing the plurality of grooves in the second barrier layer;

preparing the barrier layer and the buffer layer on the glass substrate further comprises:

preparing a second buffer layer and a third barrier layer on the second barrier layer.

2. The manufacturing method of the organic light emitting diode display device according to claim 1, wherein preparing the organic light emitting diode element layer on the thin film transistor layer comprises:

preparing a plurality of organic light emitting diode elements on the thin film transistor layer, wherein the plurality of organic light emitting diode elements are arranged at intervals.

3. The manufacturing method of the organic light emitting diode display device according to claim 2, wherein preparing the plurality of grooves in the barrier layer comprises:

preparing the plurality of grooves in a non-light emitting area in the barrier layer; wherein the non-light emitting area is an area in the barrier layer outside an area directly above the organic light emitting diode display elements.

4. The manufacturing method of the organic light emitting diode display device according to claim 2, wherein preparing the water absorbing material layer in the plurality of grooves comprises:

preparing the water absorbing material layer in the plurality of grooves by one of coating, spraying and inkjet printing.

5. The manufacturing method of the organic light emitting diode display device according to claim 1, wherein a material of the water absorbing material layer is a polyvinyl alcohol material and/or a polyoxyethylene material, and the barrier layer is made of SiNx and/or SiOx.

6. A manufacturing method of an organic light emitting diode display device, comprising:
- preparing a thin film transistor layer on a glass substrate;
- preparing an organic light emitting diode element layer on the thin film transistor layer, and preparing a barrier layer and a buffer layer on the glass substrate, wherein the barrier layer covers the organic light emitting diode element layer;
- preparing a plurality of grooves in the barrier layer, and preparing a water absorbing material layer in the plurality of grooves;
- wherein preparing the barrier layer and the buffer layer on the glass substrate comprises:
- sequentially preparing a first barrier layer, a first buffer layer and a second barrier layer on the glass substrate;
- preparing the plurality of grooves in the barrier layer comprises:
- preparing the plurality of grooves in the second barrier layer;
- preparing the barrier layer and the buffer layer on the glass substrate further comprises:
- preparing a second buffer layer and a third barrier layer on the second barrier layer;
- wherein a material of the water absorbing material layer is a polyvinyl alcohol material and/or a polyoxyethylene material, and the barrier layer is made of SiNx and/or SiOx.

7. The manufacturing method of the organic light emitting diode display device according to claim 6, wherein preparing the organic light emitting diode element layer on the thin film transistor layer comprises:
- preparing a plurality of organic light emitting diode elements on the thin film transistor layer, wherein the plurality of organic light emitting diode elements are arranged at intervals.

8. The manufacturing method of the organic light emitting diode display device according to claim 7, wherein preparing the plurality of grooves in the barrier layer comprises:
- preparing the plurality of grooves in a non-light emitting area in the barrier layer; wherein the non-light emitting area is an area in the barrier layer outside an area directly above the organic light emitting diode display elements.

9. The manufacturing method of the organic light emitting diode display device according to claim 6, wherein preparing the water absorbing material layer in the plurality of grooves comprises:
- preparing the water absorbing material layer in the plurality of grooves by one of coating, spraying and inkjet printing.

10. An organic light emitting diode display device, comprising a glass substrate, a thin film transistor layer disposed on the glass substrate, an organic light emitting diode element layer disposed on the thin film transistor layer, a barrier layer and a buffer layer disposed on the glass substrate, wherein the barrier layer covers the organic light emitting diode element layer;
- wherein a plurality of grooves is disposed in the barrier layer, and a material of water absorbing material layer is disposed in the plurality of grooves;
- wherein the barrier layer comprises a first barrier layer and a second barrier layer, and the buffer layer comprises a first buffer layer and a second buffer layer;
- the first barrier layer, the first buffer layer, the second barrier layer, the second buffer layer and the third barrier layer are sequentially arranged in a direction away from the organic light emitting diode element layer, and the plurality of grooves is disposed in the second barrier layer.

11. The organic light emitting diode display device according to claim 10, wherein the organic light emitting diode element layer comprises a plurality of organic light emitting diode elements, and each of the grooves is located in a non-light emitting area of the barrier layer, wherein the non-light emitting area is an area in the barrier layer outside an area directly above the organic light emitting diode display elements.

12. The organic light emitting diode display device according to claim 10, wherein a material of the water absorbing material layer is a polyvinyl alcohol material and/or a polyoxyethylene material, and the barrier layer is made of SiNx and/or SiOx.

* * * * *